US010547293B1

(12) United States Patent
Lin

(10) Patent No.: US 10,547,293 B1
(45) Date of Patent: Jan. 28, 2020

(54) METHOD AND APPARATUS FOR IMPROVING ACCURACY OF QUADRATURE CLOCK

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/285,308

(22) Filed: Feb. 26, 2019

(51) Int. Cl.
*H03K 3/00* (2006.01)
*H03K 5/01* (2006.01)
*H03K 19/20* (2006.01)
*H03K 17/687* (2006.01)
*H03K 5/00* (2006.01)

(52) U.S. Cl.
CPC ............. *H03K 5/01* (2013.01); *H03K 17/687* (2013.01); *H03K 19/20* (2013.01); *H03K 2005/00286* (2013.01)

(58) Field of Classification Search
CPC .... H03F 3/211; H03F 3/245; H03F 2200/336; H03F 2200/451; H03F 1/0294
See application file for complete search history.

(56) References Cited

U.S. PATENT DOCUMENTS 10,270,456 B1 * 4/2019 Lin ..................... H03L 7/0998
2008/0285697 A1 11/2008 Kim et al.
2014/0146932 A1 5/2014 Song

FOREIGN PATENT DOCUMENTS

TW         I483258 B        5/2015

OTHER PUBLICATIONS

TIPO Office Action, Taiwan Application # TW108122063, pp. 1-5.

* cited by examiner

*Primary Examiner* — Sibin Chen
(74) *Attorney, Agent, or Firm* — McClure, Qualey & Rodack, LLP

(57) ABSTRACT

A circuit and method are provided for improving the accuracy of a quadrature clock. The method includes receiving a first phase, a second phase, a third phase, and a fourth phase of a first quadrature clock; outputting a first phase of a second quadrature clock in accordance with an equal sum of the first phase and the second phase of the first quadrature clock using a first summing network; outputting a second phase of the second quadrature clock in accordance with an equal sum of the second phase and the third phase of the first quadrature clock using a second summing network; outputting a third phase of the second quadrature clock in accordance with an equal sum of the third phase and the fourth phase of the first quadrature clock using a third summing network; and outputting a fourth phase of the second quadrature clock in accordance with an equal sum of the fourth phase and the first phase of the first quadrature clock using a fourth summing network.

20 Claims, 4 Drawing Sheets

METHOD AND APPARATUS FOR IMPROVING ACCURACY OF QUADRATURE CLOCK

BACKGROUND OF THE DISCLOSURE

Field of the Invention

The present invention generally relates to quadrature clocks and more specifically to circuits that can improve accuracy of quadrature clock.

Description of Related Art

A clock is a voltage signal that periodically toggles back and forth between a low level and a high level. A quadrature clock is a clock having four phases comprising a first phase, a second phase, a third phase, and a fourth phase. Ideally, the four phases are uniformly spaced in time; that is: the first, the second, and the third phases are ahead of the second, the third, and the fourth phases by 90-degress, or equivalently one quarter of the clock period, respectively. In practice, the four phases may not be uniformly spaced in time. A uniformity in timing of the four phases of a quadrature clock determines an accuracy of the quadrature clock.

A prior art polyphase filter 100, such as that shown in FIG. 1, can be used to improve an accuracy of a quadrature clock. Here, A1, A2, A3, and A4 are four phases of an input quadrature clock; B1, B2, B3, B4 are four phases of an interim quadrature clock; and C1, C2, C3, and C4 are four phases of an output quadrature clock that has a better accuracy than the input quadrature clock. Polyphase filter 100 includes four capacitors 111, 112, 113, and 114, four resistors 121, 122, 123, and 124; and four inverter buffers 131, 132, 133, and 134. Polyphase filter 100 is well known in the prior art and thus not explained in detail here. A drawback of polyphase filter 100 is: in a monolithic integrated circuit embodiment, the four capacitors 111, 112, 113, and 114 and the four resistors 121, 122, 123, and 124 usually occupy a large physical layout area, as modern integrated circuit fabrication processes, such as a CMOS (complementary metal oxide semiconductor) process, are less area efficient for implementing capacitors and/or resistors than for implementing transistors.

What is desired is a circuit that can improve accuracy of quadrature clock, without using capacitors and/or resistors and thus is more area efficient than the prior art polyphase filter 100.

BRIEF SUMMARY OF THIS INVENTION

In an embodiment, a circuit comprises: a first summing network configured to receive a first phase and a second phase of a first quadrature clock and output a first phase of a second quadrature clock; a second summing network configured to receive a second phase and a third phase of the first quadrature clock and output a second phase of the second quadrature clock; a third summing network configured to receive a third phase and a fourth phase of the first quadrature clock and output a third phase of the second quadrature clock; and a fourth summing network configured to receive the fourth phase and the first phase of the first quadrature clock and output a fourth phase of the second quadrature clock.

In an embodiment, a method comprises: receiving a first phase, a second phase, a third phase, and a fourth phase of a first quadrature clock; outputting a first phase of a second quadrature clock in accordance with an equal sum of the first phase and the second phase of the first quadrature clock using a first summing network; outputting a second phase of the second quadrature clock in accordance with an equal sum of the second phase and the third phase of the first quadrature clock using a second summing network; outputting a third phase of the second quadrature clock in accordance with an equal sum of the third phase and the fourth phase of the first quadrature clock using a third summing network; and outputting a fourth phase of the second quadrature clock in accordance with an equal sum of the fourth phase and the first phase of the first quadrature clock using a fourth summing network.

DETAILED DESCRIPTION OF THIS DISCLOSURE

The present invention relates to quadrature clocks. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used or referenced in this disclosure, such as "node (circuit node)," "power supply node," "ground node," "signal," "voltage," "differential signal," "capacitor," "resistor," "CMOS (complementary metal oxide semiconductor)," "PMOS (P-channel metal oxide semiconductor) transistor," "NMOS (N-channel metal oxide semiconductor) transistor," "phase," "clock," "pull-up," "pull-down," and "inverter." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

A logical signal is a signal of two states: a first logical state (or a "high" state), and a second logical state (or a "low" state). When a logical signal is said to be high (low), it means it is in the "high" ("low") state, and it occurs when the logical signal is sufficiently above (below) a threshold level that is called a "trip point." Every logical signal has a trip point, and two logical signals may not necessarily have the same trip point. A clock is a periodic logical signal.

The present disclosure is presented in an engineering sense. For instance, "X is equal to Y" means: "a difference between X and Y is smaller than a specified engineering tolerance." "X is substantially smaller than Y" means: "a ratio between X and Y is smaller than a specified engineering tolerance."

Figure 1:
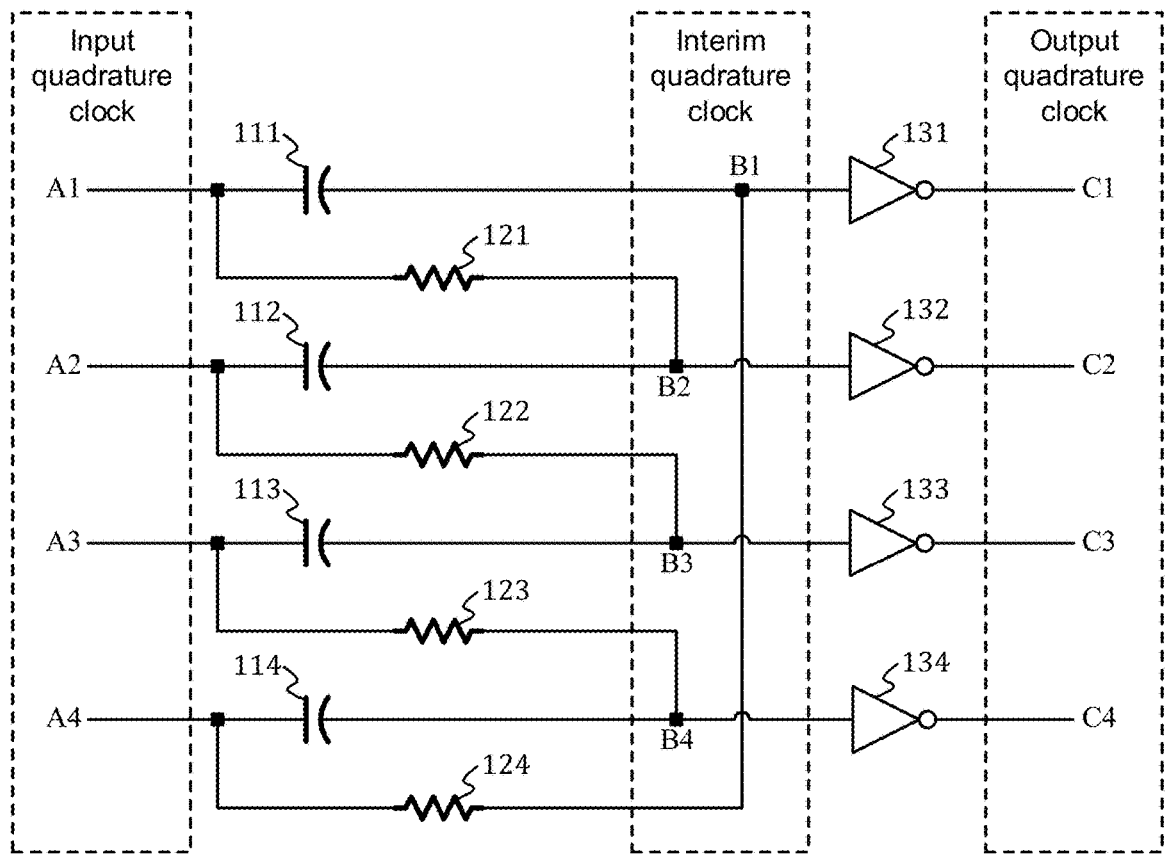
FIG. 1 shows a schematic diagram of a polyphase filter.
Figure 2A:
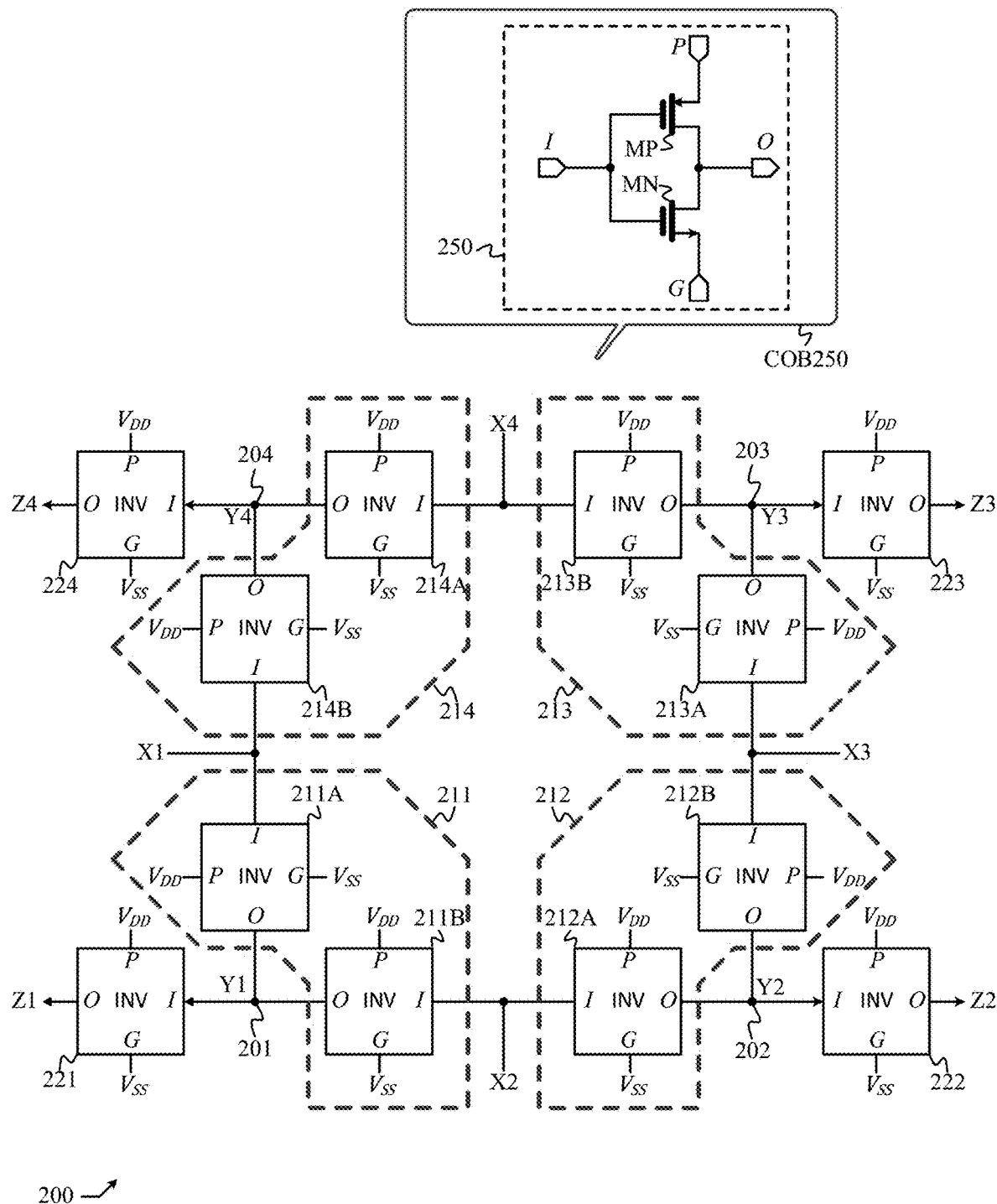
FIG. 2A shows a schematic diagram of a circuit in accordance with an embodiment of the present invention.

A schematic diagram of a circuit 200, in accordance with an embodiment of the present invention, is shown in FIG. 2A. Circuit 200 is configured to receive a first quadrature clock comprising four phases X1, X2, X3, and X4 and output a second quadrature clock comprising four phases Y1, Y2, Y3, and Y4. Circuit 200 comprises: a first summing network 211 configured to receive X1 and X2 and output Y1 to a first node 201; a second summing network 212 configured to receive X2 and X3 and output Y2 to a second node 202; a third summing network 213 configured to receive X3 and X4 and output Y3 to a third node 203; and a fourth summing network 214 configured to receive X4 and X1 and output Y4 to a fourth node 204. In a further embodiment, circuit 200 further includes four inverters (INV) 221, 222, 223, and 224 configured to receive Y1, Y2, Y3, and Y4 and output Z1, Z2, Z3, and Z4, respectively, wherein Z1, Z2, Z3, and Z4 are four phases of a third quadrature clock. Throughout this disclosure, "$V_{DD}$" denotes a power supply node, while "$V_{SS}$" denotes a ground node.

Summing network 211 comprises inverters (INV) 211A and 211B configured to receive X1 and X2, respectively, and jointly establish Y1. Summing network 212 comprises inverters (INV) 212A and 212B configured to receive X2 and X3, respectively, and jointly establish Y2. Summing network 213 comprises inverters (INV) 213A and 213B configured to receive X3 and X4, respectively, and jointly establish Y3. Summing network 214 comprises inverters (INV) 214A and 214B configured to receive X4 and X1, respectively, and jointly establish Y4. Every inverter in FIG. 2A has an input pin labeled by "I" via which a respective input signal is received, an output pin labeled by "O" via which a respective output signal is established, a power pin labeled by "P" via which a pull-up path is provided, and a ground pin labeled by "G" via which a pull-down path is provided. For instance, inverter 211A receives X1 via its "I" pin, establishes Y1 via its "O" pin, can pull up Y1 to "$V_{DD}$" via its "P" pin when X1 is low, and can pull down Y1 to "$V_{SS}$" via its "G" pin when X1 is high. Those of ordinary skills can identify the pin connections for all other inverters in FIG. 2A and therefore they are not described in detail here. Inverters 211A, 211B, 212A, 212B, 213A, 213B, 214A, and 214B are all identical. Therefore, Y1 (Y2, Y3, Y4) is approximately an equal sum of X1 (X2, X3, X4) and X2 (X3, X4, X1). As a result, a timing error of Y1 (Y2, Y3, Y4) is approximately an average between a timing error of X1 (X2, X3, X4) and a timing error of X2 (X3, X4, X1). Due to the averaging, a uniformity in timing among Y1, Y2, Y3, and Y4 are better than a uniformity in timing among X1, X2, X3, and X4.

By way of example, assume the phases of X1, X2, X3, and X4 are 0-degrees, 80-degrees, 180 degrees, and 260-degrees, respectively. In other words, timings of X2 and X4 are both 10-degress earlier than ideal. In this example, X1 and X3 are 180-degrees out of phase, since they are a complementary pair of signals that are usually generated from a differential circuit that can output two signals that are complementary to each other and thus 180-degrees out of phase. The same reasoning also explains why X2 and X4 are 180-degrees out of phase. Y1 is approximately equal to the sum of X1 and X2, and therefore has a timing that is approximately 5-degrees earlier than ideal (since an average of 0 and 10 is 5); Y2 is approximately equal to the sum of X2 and X3, and therefore has a timing that is approximately 5-dgrees earlier than ideal (since an average of 10 and 0 is 5); Y3 is approximately an equal sum of X3 and X4, and therefore has a timing that is 5-degrees earlier than ideal (since an average of 0 and 10 is 5); and Y4 is approximately an equal sum of X4 and X1, and therefore has a timing that is 5-degress earlier than ideal (since an average of 10 and 0 is 5). It is evident that, although the timings of Y1, Y2, Y3, and Y4 are not ideal, they are highly uniform. In fact, in a case where summing networks 211, 212, 213, and 214 can all provide an ideal equal sum, Y1, Y2, Y3, and Y4 can be perfectly uniform in timing.

An inverter 250 that can be used as a unit cell and instantiated to embody all inverters in FIG. 2A is shown inside call-out box COB 250. Here, "unit cell" refers to a circuit that serves as a template that can be instantiated; instantiating a unit cell means creating a replica of the circuit of the unit cell. Inverter 250 comprises a NMOS (n-channel metal oxide semiconductor) transistor MN and a PMOS (p-channel metal oxide semiconductor) transistor MP. The source, the gate, and the drain of NMOS transistor MN connect to the "G" pin, the "I" pin, and the "O" pin, respectively. The source, the gate, and the drain of PMOS transistor MP connect to the "P" pin, the "I" pin, and the "O" pin, respectively. Inverter 250 is well known in the prior art and thus not described in detail here.

Inverters 221, 222, 223, and 224 can be used as a buffer to enhance a driving capability of circuit 200. Instead of directly providing Y1, Y2, Y3, and Y4 to a subsequent application circuit (not shown in FIG. 2A), Z1, Z2, Z3, and Z4 can be provided instead. Concepts of "buffer" and "driving capability" are well known to those of ordinary skill in the art and thus are not explained in detail here. Inverters 221, 222, 223, and 224 are identical, but they may not necessarily be identical with the inverters inside summing networks 211, 212, 213, and 214, as they are used to fulfill a different function (i.e. buffering, instead of summing).

Figure 2B:
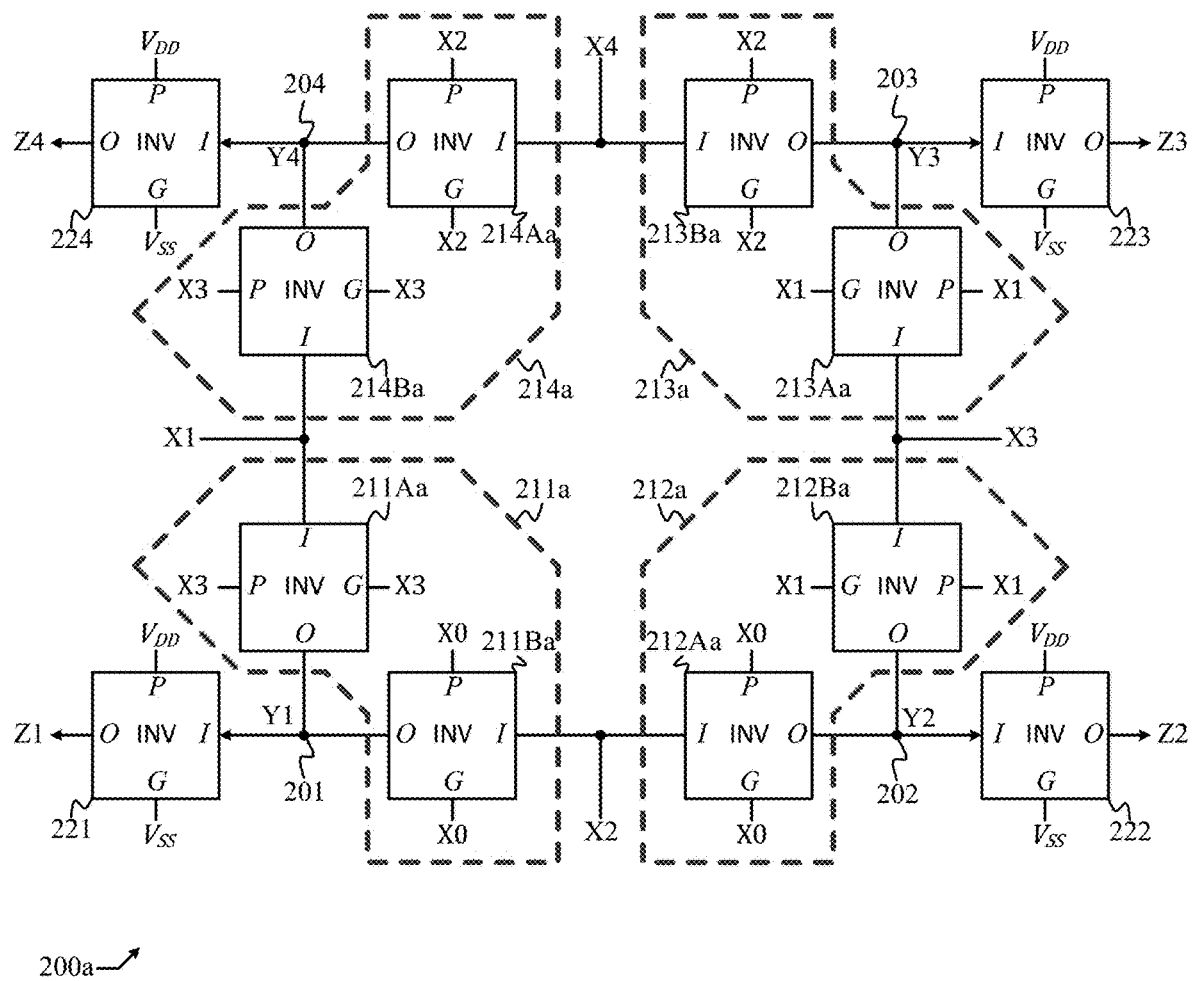
FIG. 2B shows a schematic diagram of an alternative circuit in accordance with an alternative embodiment of the present invention.

An alternative circuit 200a in accordance with an alternative embodiment of the present invention is shown in FIG. 2B. Alternative circuit 200a of FIG. 2B is the same as circuit 200 of FIG. 2A except for some alternative connections. For sake of distinction, all blocks pertaining to alternative connections are labeled with a suffix "a." More specifically: summing network 211a (212a, 213a, 214a) in FIG. 2B is a counterpart of summing network 211 (212, 213, 214) in FIG. 2A with alternative connections; inverter 211Aa (212Aa, 213Aa, 214Aa) in FIG. 2B is a counterpart of inverter 211A (212A, 213A, 214A) in FIG. 2A with alternative connections; and inverter 211Ba (212Ba, 213Ba, 214Ba) in FIG. 2B is a counterpart of inverter 211B (212B, 213B, 214B) in FIG. 2A with alternative connections. Inverters 211Aa and 214Ba provide a pull-up to X3 (instead of "$V_{DD}$") via their respective "P" pins when X1 is low and a pull-down to X3 (instead of "$V_{SS}$") via their respective "G" pins when X1 is high. Inverters 212Aa and 211Ba provide a pull-up to X0 (instead of "$V_{DD}$") via their respective "P" pins when X2 is low and a pull-down to X0 (instead of "$V_{SS}$") via their respective "G" pins when X2 is high. Inverters 213Aa and 212Ba provide a pull-up to X1 (instead of "$V_{DD}$") via their respective "P" pins when X3 is low and a pull-down to X1 (instead of "$V_{SS}$") via their respective "G" pins when X3 is high. Inverters 214Aa and 213Ba provide a pull-up to X2 (instead of "$V_{DD}$") via their respective "P" pins when X4 is low and a pull-down to X2 (instead of "$V_{SS}$") via their respective "G" pins when X4 is high.

Circuit 200a of FIG. 2B can provide a better performance than circuit 200 of FIG. 2A by eliminating a "shoot-through" condition of an inverter. For instance, inverter 211A of FIG. 2A is subject to shoot-through when X1 is around the midpoint level between "$V_{DD}$" and "$V_{SS}$," as both the NMOS transistor and PMOS transistor therein are turned on and allow a direct current to shoot through from "$V_{DD}$" to "$V_{SS}$." On the other hand, inverter 211Aa of FIG. 2B does not have this issue, as both its power pin "P" and its ground pin "G" connect to X3. However, inverter 211Aa of FIG. 2B can still fulfill the same inversion function as inverter 211A of FIG. 2A does because X3 is complementary to X1; when X1 is high and incidentally X3 is low, Y1 can be pulled down by inverter 211Aa to X3 via its "G" pin; when X1 is low and incidentally X3 is high, Y1 can be pulled up by inverter 211Aa to X3 via its "P" pin. Therefore, the inversion function is preserved but the "shoot-through" condition is eliminated. The same explanation applies to inverters 211Ba, 212Aa, 212Ba, 213Aa, 213Ba, 214Aa, and 214Ba; for each instance, the signal at its power pin "P" is the same as the signal at its ground pin "G" pin but complementary to the signal at its input pin "I." It needs to be understood, however, that the preceding circuit (not drawn in FIG. 2B) that outputs X1, X2, X3, and X4 must have a sufficient driving capability, since they need to be able to either pull up or pull down Y1, Y2, Y3, and Y4 sufficiently high or sufficiently low, otherwise the functions of inverters 211Aa, 211Ba, 212Aa, 212Ba, 213Aa, 213Ba, 214Aa, and 214Ba may fail.

Figure 3:
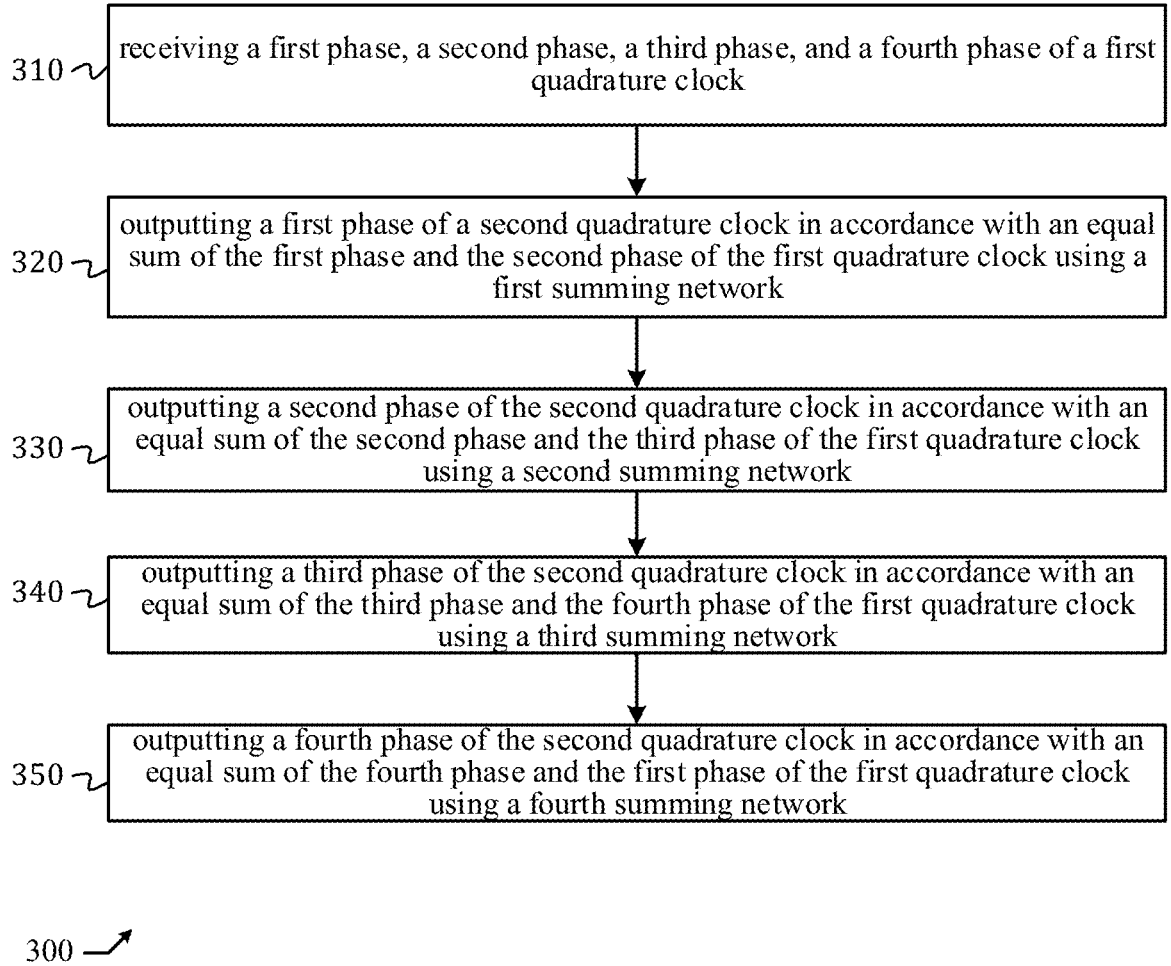
FIG. 3 shows a flow diagram of a method in accordance with an embodiment of the present disclosure.

As illustrated by a flow diagram 300 shown in FIG. 3, a method in accordance with an embodiment of the present invention comprises the following steps: (step 310) receiving a first phase, a second phase, a third phase, and a fourth phase of a first quadrature clock; (step 320) outputting a first phase of a second quadrature clock in accordance with an equal sum of the first phase and the second phase of the first quadrature clock using a first summing network; (step 330) outputting a second phase of the second quadrature clock in accordance with an equal sum of the second phase and the third phase of the first quadrature clock using a second summing network; (step 340) outputting a third phase of the second quadrature clock in accordance with an equal sum of the third phase and the fourth phase of the first quadrature clock using a third summing network; and (step 350) outputting a fourth phase of the second quadrature clock in accordance with an equal sum of the fourth phase and the first phase of the first quadrature clock using a fourth summing network.

Those skilled in the art will readily observe that numerous modifications and alterations of the device and method may be made while retaining the teachings of the invention. Accordingly, the above disclosure should not be construed as limited only by the metes and bounds of the appended claims.

What is claimed is:

1. A circuit comprising:
    a first summing network configured to receive a first phase and a second phase of a first quadrature clock and output a first phase of a second quadrature clock;
    a second summing network configured to receive the second phase and a third phase of the first quadrature clock and output a second phase of the second quadrature clock;
    a third summing network configured to receive the third phase and a fourth phase of the first quadrature clock and output a third phase of the second quadrature clock; and
    a fourth summing network configured to receive the fourth phase and the first phase of the first quadrature clock and output a fourth phase of the second quadrature clock.

2. The circuit of claim 1, wherein: the first summing network comprises a first inverter and a second inverter configured to receive the first phase and the second phase of the first quadrature clock, respectively, and jointly establish the first phase of the second quadrature clock; the second summing network comprises a third inverter and a fourth inverter configured to receive the second phase and the third phase of the first quadrature clock, respectively, and jointly establish the second phase of the second quadrature clock; the third summing network comprises a fifth inverter and a sixth inverter configured to receive the third phase and the fourth phase of the first quadrature clock, respectively, and jointly establish the third phase of the second quadrature clock; and the fourth summing network comprises a seventh inverter and an eighth inverter configured to receive the fourth phase and the first phase of the first quadrature clock, respectively, and jointly establish the fourth phase of the second quadrature clock.

3. The circuit of claim 2, wherein the first inverter, the second inverter, the third inverter, the fourth inverter, the fifth inverter, the sixth inverter, the seventh inverter, and the eighth inverter are identical and instantiated from a same unit cell.

4. The circuit of claim 3, wherein the unit cell comprises an input pin, an output pin, a power pin, and a ground pin, wherein an input of the unit cell is received from the input pin, an output of the unit cell is delivered to the output pin, a pull-up of the output of the unit cell is established via the power pin when the input of the unit cell is low, and a pull-down of the output of the unit cell is established via the ground pin when the input of the unit cell is high.

5. The circuit of claim 4, wherein the unit cell comprises a NMOS (n-channel metal oxide semiconductor) transistor and a PMOS (p-channel metal-oxide semiconductor) transistor.

6. The circuit of claim 5, wherein a source, a gate, and a drain of the NMOS transistor connect to the ground pin, the input pin, and the output pin, respectively, while a source, a gate, and a drain of the PMOS transistor connect to the power pin, the input pin, and the output pin, respectively.

7. The circuit of claim 4, wherein the power pin of the unit cell is connected to a power node, while the ground pin of the unit cell is connected to a ground node.

8. The circuit of claim 4, wherein the power pin and the ground pin of the unit cell are both connected to a common pulling signal.

9. The circuit of claim 8, wherein the common pulling signal is complementary to the input of the unit cell, so that the output of the unit cell can be pulled up when the input of the unit cell is low and pulled down when the input of unit cell is high.

10. The circuit of claim 1, further comprising a first inverter buffer, a second inverter buffer, a third inverter buffer, and a fourth inverter buffer configured to receive the first phase, the second phase, the third phase, and the fourth phase of the second quadrature clock and output a first phase, a second phase, a third phase, and a fourth phase of a third quadrature clock, respectively.

11. A method comprising:
    receiving a first phase, a second phase, a third phase, and a fourth phase of a first quadrature clock;
    outputting a first phase of a second quadrature clock in accordance with an equal sum of the first phase and the second phase of the first quadrature clock using a first summing network;
    outputting a second phase of the second quadrature clock in accordance with an equal sum of the second phase and the third phase of the first quadrature clock using a second summing network;
    outputting a third phase of the second quadrature clock in accordance with an equal sum of the third phase and the fourth phase of the first quadrature clock using a third summing network; and outputting a fourth phase of the second quadrature clock in accordance with an equal sum of the fourth phase and the first phase of the first quadrature clock using a fourth summing network.

12. The method of claim 11, wherein: the first summing network comprises a first inverter and a second inverter configured to receive the first phase and the second phase of the first quadrature clock, respectively, and jointly establish the first phase of the second quadrature clock; the second summing network comprises a third inverter and a fourth inverter configured to receive the second phase and the third phase of the first quadrature clock, respectively, and jointly establish the second phase of the second quadrature clock; the third summing network comprises a fifth inverter and a sixth inverter configured to receive the third phase and the fourth phase of the first quadrature clock, respectively, and jointly establish the third phase of the second quadrature clock; and the fourth summing network comprises a seventh inverter and an eighth inverter configured to receive the fourth phase and the first phase of the first quadrature clock, respectively, and jointly establish the fourth phase of the second quadrature clock.

13. The method of claim 12, wherein the first inverter, the second inverter, the third inverter, the fourth inverter, the fifth inverter, the sixth inverter, the seventh inverter, and the eighth inverter are identical and instantiated from a same unit cell.

14. The method of claim 13, wherein the unit cell comprises an input pin, an output pin, a power pin, and a ground pin, wherein an input of the unit cell is received from the input pin, an output of the unit cell is delivered to the output pin, a pull-up of the output of the unit cell is established via the power pin when the input of the unit cell is low, and a pull-down of the output of the unit cell is established via the ground pin when the input of the unit cell is high.

15. The method of claim 14, wherein the unit cell comprises a NMOS (n-channel metal oxide semiconductor) transistor and a PMOS (p-channel metal-oxide semiconductor) transistor.

16. The method of claim 15, wherein a source, a gate, and a drain of the NMOS transistor connect to the ground pin, the input pin, and the output pin, respectively, while a source, a gate, and a drain of the PMOS transistor connect to the power pin, the input pin, and the output pin, respectively.

17. The method of claim 14, wherein the power pin of the unit cell is connected to a power node, while the ground pin of the unit cell is connected to a ground node.

18. The method of claim 14, wherein the power pin and the ground pin of the unit cell are both connected to a common pulling signal.

19. The method of claim 18, wherein the common pulling signal is complementary to the input of the unit cell, so that the output of the unit cell can be pulled up when the input of the unit cell is low and pulled down when the input of unit cell is high.

20. The method of claim 11, further comprising outputting a first phase, a second phase, a third phase, and a fourth phase of a third quadrature clock in accordance with the first phase, the second phase, the third phase, and the fourth phase of the second quadrature clock by using a first inverter buffer, a second inverter buffer, a third inverter buffer, and a fourth inverter buffer, respectively.

* * * * *